(12) United States Patent
Zubia et al.

(10) Patent No.: US 10,931,282 B2
(45) Date of Patent: Feb. 23, 2021

(54) SELF-CONTAINED RECONFIGURABLE PERSONAL LABORATORY

(71) Applicant: Board of Regents, The University of Texas System, Austin, TX (US)

(72) Inventors: David Zubia, El Paso, TX (US); Sergio F. Almeida Loya, Juarez (MX)

(73) Assignee: Board of Regents, The University of Texas System, Austin, TX (US)

( * ) Notice: Subject to any disclaimer, the term of this patent is extended or adjusted under 35 U.S.C. 154(b) by 625 days.

(21) Appl. No.: 15/616,264

(22) Filed: Jun. 7, 2017

(65) Prior Publication Data

US 2017/0363678 A1 Dec. 21, 2017

Related U.S. Application Data

(60) Provisional application No. 62/350,945, filed on Jun. 16, 2016.

(51) Int. Cl.
*G01R 31/28* (2006.01)
*H03K 19/0175* (2006.01)
(Continued)

(52) U.S. Cl.
CPC ........... *H03K 19/017581* (2013.01); *G01R 31/31908* (2013.01); *G06F 30/34* (2020.01); *G06F 30/36* (2020.01)

(58) Field of Classification Search
CPC ...... G09B 7/02; G09B 23/186; H03K 19/173; H03K 19/17732; H03K 19/017581;
(Continued)

(56) References Cited

U.S. PATENT DOCUMENTS

| 4,315,320 A | * | 2/1982 | Gabriel | ............... G09B 23/186 434/118 |
| 4,464,120 A | * | 8/1984 | Jensen | ............... G09B 23/186 434/201 |

(Continued)

OTHER PUBLICATIONS

Krein, P. T., ECE 69—Power Electronics Laboratory, Laboratory Information and Guide, Department of Electrical and Computer Engineering, University of Illinois, Urbana, Illinois, Version 2.5—Aug. 2014, 137 pages.

*Primary Examiner* — Lee E Rodak
*Assistant Examiner* — Brent J Andrews
(74) *Attorney, Agent, or Firm* — Yee & Associates, P.C.

(57) ABSTRACT

A personal laboratory includes a self-contained, miniaturized, portable kit that provides for design, testing, and automated assembling, dissembling, and reassembling of a physical system (rather than a simulation) with flexibility as to the variety of configurations of components that may be designed and assembled, and easy integration of complex components. The personal laboratory includes a reconfigurable system, the reconfigurable system includes a plurality of functional components, and a plurality of connectors configured for operatively connect respective functional components to other functional components; a stimulus generator configured to apply a stimulus to the reconfigurable system; and a measurement system configured to measure a response to the applied stimulus generated by the reconfigurable system. In the context of electronic circuits, the reconfigurable system is a reconfigurable circuit, the functional components are circuit elements and the connectors are electrical connectors.

20 Claims, 6 Drawing Sheets

(51) Int. Cl.
*G01R 31/319* (2006.01)
*G06F 30/34* (2020.01)
*G06F 30/36* (2020.01)

(58) Field of Classification Search
CPC .............. H03K 19/177; G06F 17/5063; G06F 17/5054; G06F 30/34; G06F 30/36; G06F 30/20; G06F 1/12; G01R 31/31908; H04B 1/06; H04B 1/02; H04B 3/02; H04B 10/524; H04L 25/03834; H04L 27/06; G04G 7/00; H04J 3/0644
See application file for complete search history.

(56) References Cited

U.S. PATENT DOCUMENTS

| | | | |
|---|---|---|---|
| 4,648,783 A | 3/1987 | Tan et al. | |
| D293,452 S | 12/1987 | Gabriel | |
| 5,247,454 A | 9/1993 | Farrington et al. | |
| 5,484,293 A | 1/1996 | Ford et al. | |
| 5,562,454 A | 10/1996 | Kanzaki et al. | |
| 6,813,473 B1* | 11/2004 | Bruker | G09B 7/02 434/118 |
| D508,265 S | 8/2005 | Nesenoff | |
| 7,016,949 B1 | 3/2006 | Tagawa | |
| D529,091 S | 9/2006 | Nesenoff | |
| 7,470,867 B1 | 12/2008 | Cope et al. | |
| 8,099,540 B2 | 1/2012 | Hanai et al. | |
| 8,342,332 B2 | 1/2013 | Alhajri | |
| 8,406,682 B2 | 3/2013 | Elesseily et al. | |
| 9,299,424 B2 | 3/2016 | Nakaya | |
| 9,350,356 B2 | 5/2016 | Tatsumura et al. | |
| 2003/0183871 A1* | 10/2003 | Dugger | G06G 7/12 257/314 |
| 2006/0261846 A1* | 11/2006 | Twigg | H03K 19/173 326/37 |
| 2012/0286588 A1* | 11/2012 | Steeneken | H01H 59/0009 307/115 |
| 2013/0106462 A1* | 5/2013 | Yang | H03K 19/177 326/39 |
| 2013/0207827 A1* | 8/2013 | Nestler | H03M 1/12 341/172 |
| 2014/0265760 A1 | 9/2014 | Layne et al. | |
| 2015/0180503 A1* | 6/2015 | Schubert | H03M 3/46 341/143 |

\* cited by examiner

SELF-CONTAINED RECONFIGURABLE PERSONAL LABORATORY

CROSS-REFERENCE TO PROVISIONAL APPLICATION

This nonprovisional patent application claims the benefit under 35 U.S.C. § 119(e) and priority to U.S. Provisional Patent Application Ser. No. 62/350,945, filed on Jun. 16, 2016, entitled "Self-Contained Reconfigurable Research Laboratory," which is hereby incorporated herein by reference in its entirety.

TECHNICAL FIELD

Embodiments relate to individualized laboratory equipment for constructing and testing engineering and applied scientific devices. More particularly, embodiments relate to such equipment in the form of an all-in-one, self-contained, miniaturized, portable kit, that provides for design, testing, and easy, quick, and automated assembling, dissembling, and reassembling of an actual hardware circuit or system (rather than a simulation) with flexibility as to the variety of configurations of components that may be designed and assembled, and easy integration of complex circuitry.

BACKGROUND

The provision and maintenance of a scientific or engineering laboratory requires considerable expense, physical space, and management and supervision of the equipment and the users. Accordingly, in a traditional classroom setting, only a limited amount of laboratory equipment is provided. Thus, it is not possible to provide each individual student with his or her own laboratory setup. Rather, students must work in groups, each group being provided with a single lab setup for a number of students. This arrangement dilutes the educational experience, as many students receive little or no individual hands-on experience with the lab equipment. In the case of distance or online education, which is becoming increasingly popular, the requirements noted above (expense, space, and management/supervision) make it even less feasible to provide students with hands-on lab experience. Accordingly, lab courses are generally not provided in distance or online education.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved electronics personal laboratory.

It is another aspect of the disclosed embodiments to provide or a self-contained reconfigurable personal laboratory.

It is yet another aspect of the disclosed embodiments to provide for a self-contained reconfigurable personal laboratory that includes a reconfigurable circuit.

The aforementioned aspects and other objectives and advantages can now be achieved as described herein. An electronics personal laboratory and methods thereof are disclosed herein. In one example embodiment, an electronics personal laboratory can be implemented which includes a reconfigurable circuit, the reconfigurable circuit comprising a plurality of circuit elements, and a plurality of electrical connectors configured for electrically connecting respective ones of the plurality of circuit elements to other ones of the plurality of circuit elements; a signal generator configured to apply a stimulus to the reconfigurable circuit; and a data acquisition system (DAQ) configured to measure a response to the applied stimulus, the response generated by the reconfigurable circuit.

The circuit elements comprise, for example, one or more of the following: a resistor, an inductor, a capacitor, a transistor, a diode, an operational amplifier, an electrical source, and a meter. In some example embodiments, each of the electrical connectors can be configured for electrically connecting a respective one of the circuit elements to one or more other ones of the plurality of circuit elements, for electrically disconnecting a respective one of the circuit elements from one or more other ones of the plurality of circuit elements, and for electrically reconnecting a respective one of the circuit elements to one or more other ones of the plurality of circuit elements.

In another example embodiment, the electrical connectors can include microelectromechanical system (MEMS) relays. In some example embodiments, the electrical connectors may be semiconductor switches. In yet another example embodiment, the reconfigurable circuit can be a field-programmable analog array.

In another example embodiment, the aforementioned electronics personal laboratory can include a computer device comprising a memory and a processor operably coupled to the memory; software comprising instructions that can be loaded in the memory and executed on the processor to perform operations comprising: allowing a user to design a circuit by selecting circuit elements and indicating electrical connections to be established between the selected circuit elements; and causing the designed circuit to be physically realized by the reconfigurable circuit.

In still another example embodiment, a user interface can be configured for permitting a user to interact with software to design a circuit by selecting circuit elements and indicating electrical connections to be established between the selected circuit elements; cause the signal generator to apply a stimulus to the reconfigurable circuit; and receive indication of a response to an applied stimulus, the response generated by the reconfigurable circuit and obtained by the DAQ. The user interface can be, for example, a graphical user interface (GUI).

In some example embodiments, a peripheral device can be configured to be activated or deactivated by a circuit formed by the reconfigurable circuit, wherein activation of the peripheral device causes the peripheral device to produce a physical effect. The peripheral device can be, for example, an actuator, a sensor, a display, or a light. In some example embodiments, the reconfigurable breadboard may be operatively connected to the reconfigurable circuit. In still another example embodiment, control equipment can be configured to prevent damage to the circuit elements.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
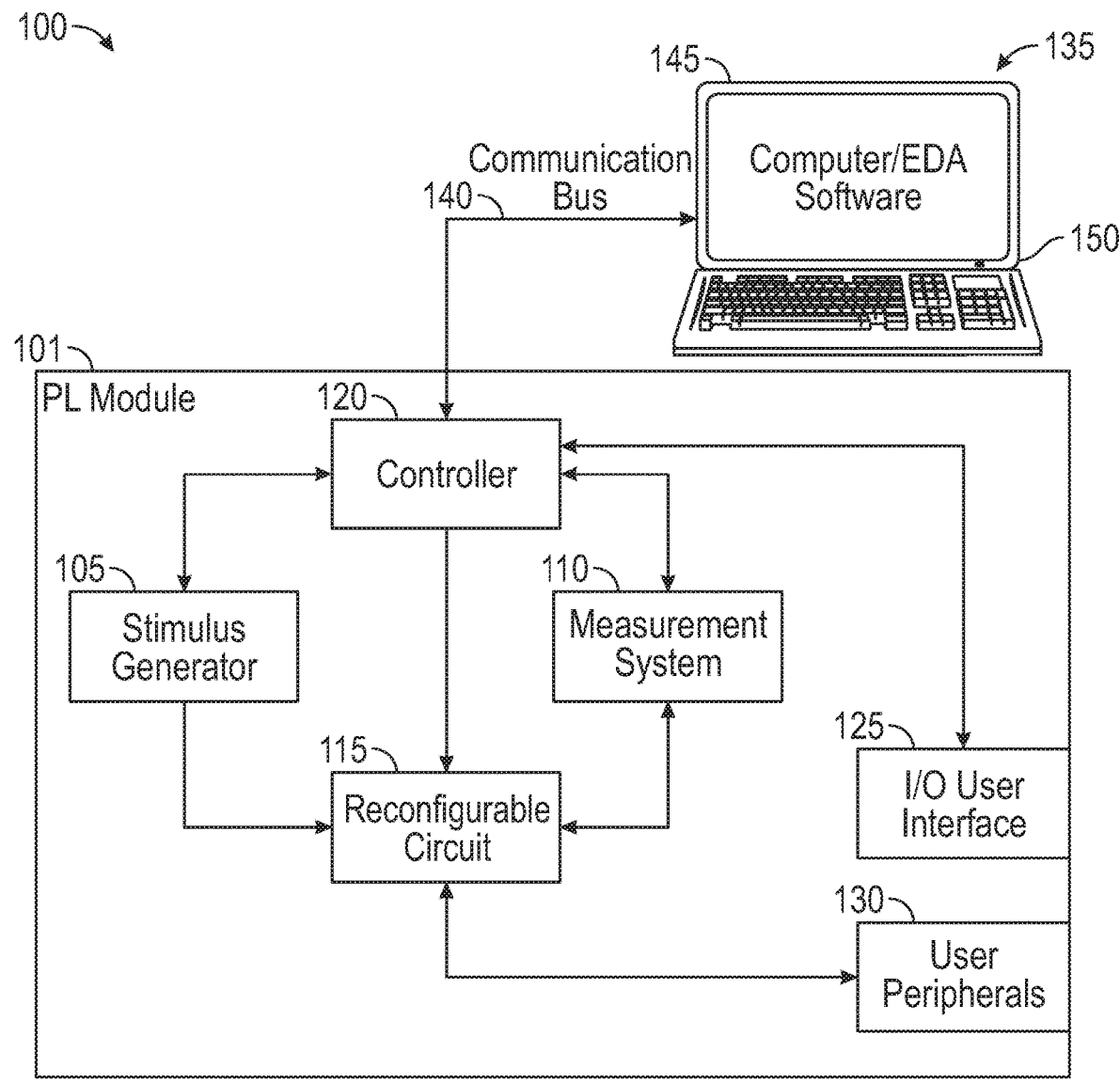
FIG. 1 illustrates a block diagram of an electro personal laboratory, in accordance with an example embodiment.

The particular values and configurations discussed in these non-limiting examples can be varied and are cited merely to illustrate at least one embodiment and are not intended to limit the scope thereof.

The example embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art. Like numbers refer to identical, like, or similar elements throughout, although such numbers may be referenced in the context of different embodiments. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The foregoing description of the figures is provided for the convenience of the reader. It should be understood, however, that the embodiments are not limited to the precise arrangements and configurations shown in the figures. Also, the figures are not necessarily drawn to scale, and certain features may be shown exaggerated in scale or in generalized or schematic form, in the interest of clarity and conciseness. Relatedly, certain features may be omitted in certain figures, and this may not be explicitly noted in all cases.

While various embodiments are described herein, it should be appreciated that the present invention encompasses many inventive concepts that may be embodied in a wide variety of contexts. Thus, the following detailed description of exemplary embodiments, read in conjunction with the accompanying drawings, is merely illustrative and is not to be taken as limiting the scope of the disclosed embodiments. Rather, the scope of the invention is defined by the appended claims and equivalents thereof.

Illustrative embodiments of the invention are described below. In the interest of clarity, not all features of an actual implementation are necessarily described for each embodiment disclosed in this specification. In the development of any such actual embodiment, numerous implementation-specific decisions must be made to achieve the design-specific goals, which will vary from one implementation to another. It will be appreciated that such a development effort, while possibly complex and time-consuming, would nevertheless be a routine undertaking for persons of ordinary skill in the art having the benefit of this disclosure.

Embodiments disclosed herein are applicable to a wide range of scientific and engineering disciplines (e.g., electronics/electrical engineering, electromagnetics, mechanics/mechanical engineering, mechatronics, optics, fluidics, sensors, actuators, thermal systems, biology, chemistry, combinations of the foregoing, and other disciplines). For simplicity, the following description focuses primarily on the case of electronics/electrical engineering.

Generally speaking, the construction and testing of an electronic circuit or system may involve the circuit or system being developed and tested, a signal generator to apply an input or stimulus to the circuit/system, and a data acquisition/measurement system to acquire the output or measure the response of the circuit/system, as well as wiring interconnecting these components. The circuit/system may include a set of electronic components (e.g., circuit elements) appropriately interconnected by wiring, resulting in an interconnected network of electronic components and wiring. Such circuit/system may be created on a breadboard.

The signal generator and data acquisition/measurement system may be suitably coupled to the circuit/system. The completed circuit/system may be tested by applying an electronic stimulus or input to the circuit/system (e.g., an applied voltage or current) and measuring the response of the circuit/system to the applied stimulus, or the output generated in response to the applied input. If the desired response is not achieved, the circuit/system may be dissembled and reconfigured, that is, reassembled with some variation relative to the initial circuit/system, and re-tested. This process may be iterated multiple times, until a desired response is achieved. One reason for this iteration or reconfiguration of the circuit/system may be that the physical properties of the circuit elements result in performance (response) that deviates from that (e.g., their idealized functional performance/response) dictated/predicted by the engineering model that the user is trying to implement/realize in the physical circuit/system.

The process of reconfiguration/iteration may be an important part of the circuit/system development and testing process, as well as of the learning process pertaining thereto. Another reason for the aforementioned iteration or reconfiguration of the circuit/system may be the presence of wiring errors (wrong connections) in the circuit/system being developed. It may be difficult, time-consuming and frustrating to find such wiring errors. This process of correcting wiring errors does not have significant educational value to the student learning how to develop and test circuits. Wiring errors may also impede learning by causing confusion or leading to erroneous conclusions.

Embodiments disclosed herein address and mitigate the problems of expense, space, and management/supervision discussed above, as well as the wiring error problem and other problems discussed below. Embodiments disclosed herein provide laboratory equipment for constructing and testing engineering and applied scientific devices, in the form of all-in-one, self-contained, miniaturized, portable (mobile) kits, that provide for design, testing, and easy, quick, and automated assembling, dissembling, and reassembling of an actual hardware circuit or system (rather than a simulation), with flexibility as to the variety of configurations of components that may be designed and assembled, and easy integration of complex circuitry, thus facilitating individualized hands-on lab experience and promoting laboratory education. Such a kit, or personal laboratory, may be used instead of a traditional laboratory and serves to make lab courses accessible to distance learners and also to make hands-on lab experience available to a greater number of students in a traditional laboratory class setting. Such a kit can also be utilized in areas other than educational uses such as, for example, for hobbyist, industrial and other applications.

FIG. 1 illustrates a block diagram of an electronics personal laboratory 100, in accordance with an example embodiment. As shown in FIG. 1, the electronics personal laboratory 100 includes a stimulus generator 105, a measurement system 110, and a reconfigurable circuit 115. The stimulus generator 105 is electrically coupled to the reconfigurable circuit 115 and is configured to apply an input or stimulus to the reconfigurable circuit 115. Stimulus generator 105 may be a signal generator and the input or stimulus may be a voltage or current.

The measurement system 110 is electrically coupled to the reconfigurable circuit 115 and is configured to receive or measure an output or response to the applied input or stimulus, the output or response having been generated by the reconfigurable circuit 115 in response to the applied input or stimulus. Measurement system 110 may be a data acquisition system (DAQ), and the output or response may be a measured voltage, current, or other electrical quantity. Electrical connections between stimulus generator 105, measurement system 110, the reconfigurable circuit 115, and controller 120 (described below) may be provided by wiring or other suitable conductors, signal traces, conductive tracks, etc.

Figure 2:
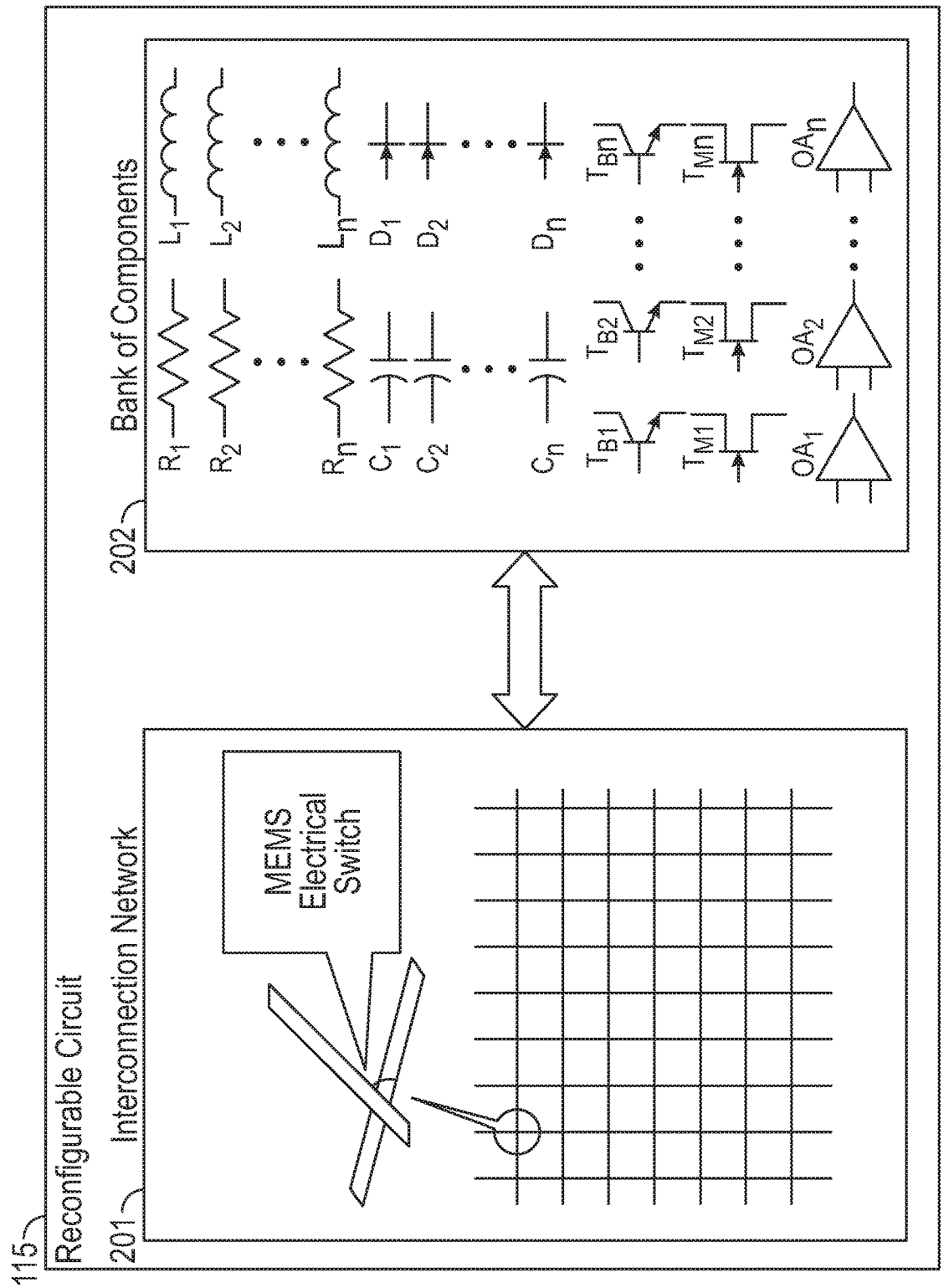
FIG. 2 illustrates a schematic representation of a reconfigurable circuit and an element of the electronics personal laboratory depicted in FIG. 1, in accordance with an example embodiment.

FIG. 2 illustrates a conceptual diagram of a reconfigurable circuit such as the reconfigurable circuit 115 shown in FIG. 1, in accordance with an example embodiment. The reconfigurable circuit 115 may be thought of conceptually and functionally as an interconnection matrix or network 201 and a bank 202 of circuit elements. That is, (generally speaking and subject to certain limitations described below) using the reconfigurable circuit 115, a user may (electrically) connect any circuit element to any other circuit element (or multiple circuit elements) at will; once any such connection is established, the user may disconnect it at will; and once a connection is disconnected, the user may reconnect it at will. How the user creates and undoes the connections will be explained below.

The actual hardware implementation or realization of the reconfigurable circuit 115 may be as follows. Reconfigurable circuit 115 may include (A) a plurality of circuit elements and (B) a plurality of electrical connectors configured for electrically connecting respective ones of the plurality of circuit elements to other ones of the plurality of circuit elements. The plurality of circuit elements may include one or more of the following: resistors, inductors, capacitors, transistors, diodes, operational amplifiers, electrical sources (e.g., power supplies, etc.), meters (e.g., volt meters, etc.), other electronic devices (e.g., memristors, finfets, etc.), etc.

Each of the electrical connectors is configured for electrically connecting (establishing an electrical connection between) two or more circuit elements (put in other words, for electrically connecting a circuit element to one or more other circuit elements), for electrically disconnecting (preventing an electrical connection between) two or more circuit elements (put in other words, for electrically disconnecting a circuit element from one or more other circuit elements), and for electrically reconnecting (reestablishing an electrical connection between) two or more circuit elements (put in other words, for electrically reconnecting a circuit element to one or more other circuit elements). Thus, the term "electrical connector" is to be understood as a device that has the following functionality: it can (be used to) both establish an electrical connection between multiple elements and prevent an electrical connection between multiple elements. Examples of electrical connectors would be: plug and socket; switch; screw terminal; binding post; alligator clamp; etc. (Embodiments disclosed herein may use electrical connectors, described below, other than these example electrical connectors, and not all of these example electrical connectors provide or facilitate all of the advantages (e.g., miniaturization, automated connection and disconnection) discussed herein). The term "electrically connect" and variations thereon are used interchangeably with the term "electrically couple" and variations thereon. In the context of the electrical connectors, the term "electrically connect" is generally used to highlight the fact that an electrical connector may connect (establish an electrical connection) between two elements or between more than two elements.

According to some embodiments, each electrical connector may comprise one or more relays or switches. (The terms "switch" and "relay" are used interchangeably herein.) The switch may be a microelectromechanical system (MEMS) relay, a semiconductor switch (such a as transistor, e.g., a MOSFET), an electromagnetic relay, or another kind of switch.

Thus, in an example embodiment, the interconnection network 201 may be populated with a large number of each of various kinds of circuit elements, with respective paths between many respective pairs of elements, where each path represents a potential or actual electrical connection between a pair of elements, depending on the state of the switch(es) along the path. For example, if a path containing one switch physically connects a resistor and an inductor, then if the switch is closed, an electrical connection is established between the resistor and the inductor, and if the switch is open, an electrical connection between the resistor and the inductor is prevented. In some cases, a path between two elements may contain multiple switches. In such case, if all the switches are closed, an electrical connection between the two elements is established, and if all the switches are open, an electrical connection between the two elements is prevented.

In view of the distance or separation that may exist between two elements, the path between the two elements may include not only the switch but also wiring, a signal trace, a conductive track, a lead, or other one or more electrical conductors. These electrical conductors (in addition to the switch that is controlled—opened or closed—to establish or prevent the electrical connection) may be considered part of the above-defined electrical connectors. For simplicity of the explanation, in this disclosure, reference to these conductors may sometimes be omitted and electrical connectors may sometimes be discussed as if the electrical connector is a mere switch or group of switches.

It will be understood that a single switch may connect two elements or a greater number of elements. For example, a switch may connect element R to elements C and L. This may occur, e.g., because the switch connects R to a path that (e.g., bifurcates and) leads to both C and L separately, or this may occur, e.g., because the switch connects R to a path that leads only to C, but C and L are already independently connected to each other by another path and a closed switch on that path.

By providing such an interconnection network 201 populated with a bank 202 of circuit elements, the circuit elements being electrically connectable and disconnectable as described, the reconfigurable circuit 115 provides enormous flexibility as to what circuit elements can be electrically connected to one another, and hence what configurations of electrically connected elements—what circuits—can be created. Because electrical connections once made can be freely disconnected and reconnected, and/or other connections can be made instead, great flexibility is provided not only in creating circuits, but also in disassembling, changing, and recreating circuits, i.e., circuits are not only freely configurable but also freely reconfigurable. Thus, a student can use the electronics personal laboratory 100 to create and test many different kinds of circuits and hence solve many different kinds of electrical engineering problems such as would be presented in the context of a course on circuits or electrical engineering.

According to some embodiments, the reconfigurable circuit 115 may comprise a field programmable analog array (FPAA). Like the arrangement described above, an FPAA includes a plurality of circuit elements or blocks (e.g., combinations of circuit elements designed to perform a certain function) populating an interconnection network, i.e., with electrical connectors between respective pairs of elements/blocks (as described above, the connectors being configured for electrically connecting, disconnecting, and reconnecting respective pairs of elements/blocks). Examples of FPAAs that could be used in this regard are FPAAs produced by Anadigm®.

According to some embodiments, the electrical connectors used in the FPAAs may be MOSFETS used in a pass gate type architecture. With regard to the MEMS switches or relays, they may employ any of various types of MEMS. MEMS switches and/or MEMS relays may be arranged in arrays to create the interconnection network 201. Because contact of these devices may be metal to metal, it is possible to achieve a contact resistance below, for example, 1 Ohm with a current near 1 Ampere.

Furthermore, the switching control terminal may be electrically isolated by an air gap or a dielectric from the signal terminal, creating independent voltage levels between the control and signal paths. With regard to transistor switches or relays, they may employ any of various types of analog switches and/or multiplexers. These devices can be arranged in cross-bar or multistage (hierarchical) architectures to create the interconnection network 201. Examples of analog switches that could be used are pass transistors, CMOS transmission gates, and switches and multiplexors such as those produced by Maxim Integrated™ Products, Inc. (Maxim is a registered trademark, and Maxim Integrated is a trademark, of Maxim Products, Inc.). According to some example embodiments, the sizes of switching transistor arrays may range, for example, from 8×8 to 16×16 inclusive, According to some example embodiments, the range of maximum signal levels may be, for example, from 5 to 12 Volts inclusive. According to some other example embodiments, the range of contact resistance (Ron) may be, for example, from 65 to 200 Ohms inclusive.

MEMS switches may have a lower parasitic resistance than semiconductor switches. For some applications, a lower parasitic resistance may be preferable, e.g., the performance of an actual circuit having a relatively low parasitic resistance will match the intended or theoretical/ideal performance of the corresponding designed circuit relatively more closely than the performance of an actual circuit having a relatively high parasitic resistance. For some applications, a higher parasitic resistance may be preferable, e.g., a heightened discrepancy between a circuit's actual performance and the intended/theoretical/ideal performance of the corresponding designed circuit may be useful in educating students about the limits of simulations and theoretical models and about the physics of the actual devices. In an educational context, the efficiency of the circuit in performing its function, and hence the correspondence between actual and theoretical/ideal performance, is not as important as it would be in a commercial application.

The electronics personal laboratory 100 may also include a controller 120 for interfacing/mediating between stimulus generator 105, measurement system 110, the reconfigurable circuit 115, user interface(s) (discussed below), and an associated computer device (discussed below). The controller may keep track of whether the electronics personal laboratory 100 is in a configuration mode or testing mode. During the configuration mode, the controller may translate data inputted by the user to configure the reconfigurable circuit 115 (this user configuration of reconfigurable circuit 115 is described below). It may also configure the stimulus generator 105 and measurement system 110. During the testing mode, the controller may synchronize stimulus generator 105 and measurement system 110 and keep track of when a response signal is received relative to when a stimulus signal is applied, in order to determine circuit response time in a transient experiment or phase shift in a steady-state experiment. According to some embodiments, the controller may also limit the power of the stimulus generator 105 to prevent damage to the reconfigurable circuit 115, as described below.

The use of MEMS or semiconductor switches or an FPAA for the reconfigurable circuit 115 permits miniaturization of the reconfigurable circuit 115. (The use of electromagnetic relays, due to their size, may not permit miniaturization to the same degree.) Stimulus generator 105, measurement system 110, and controller 120 may also be miniaturized, as known to those of ordinary skill in the art. In some embodiments, stimulus generator 105, measurement system 110, the reconfigurable circuit 115, and controller 120 may be formed as an integrated circuit (IC) or a suite of ICs. In some embodiments, the circuit elements of the reconfigurable circuit 115 may be formed as ICs. Accordingly, electronics personal laboratory 100 may be miniaturized.

Figure 3:
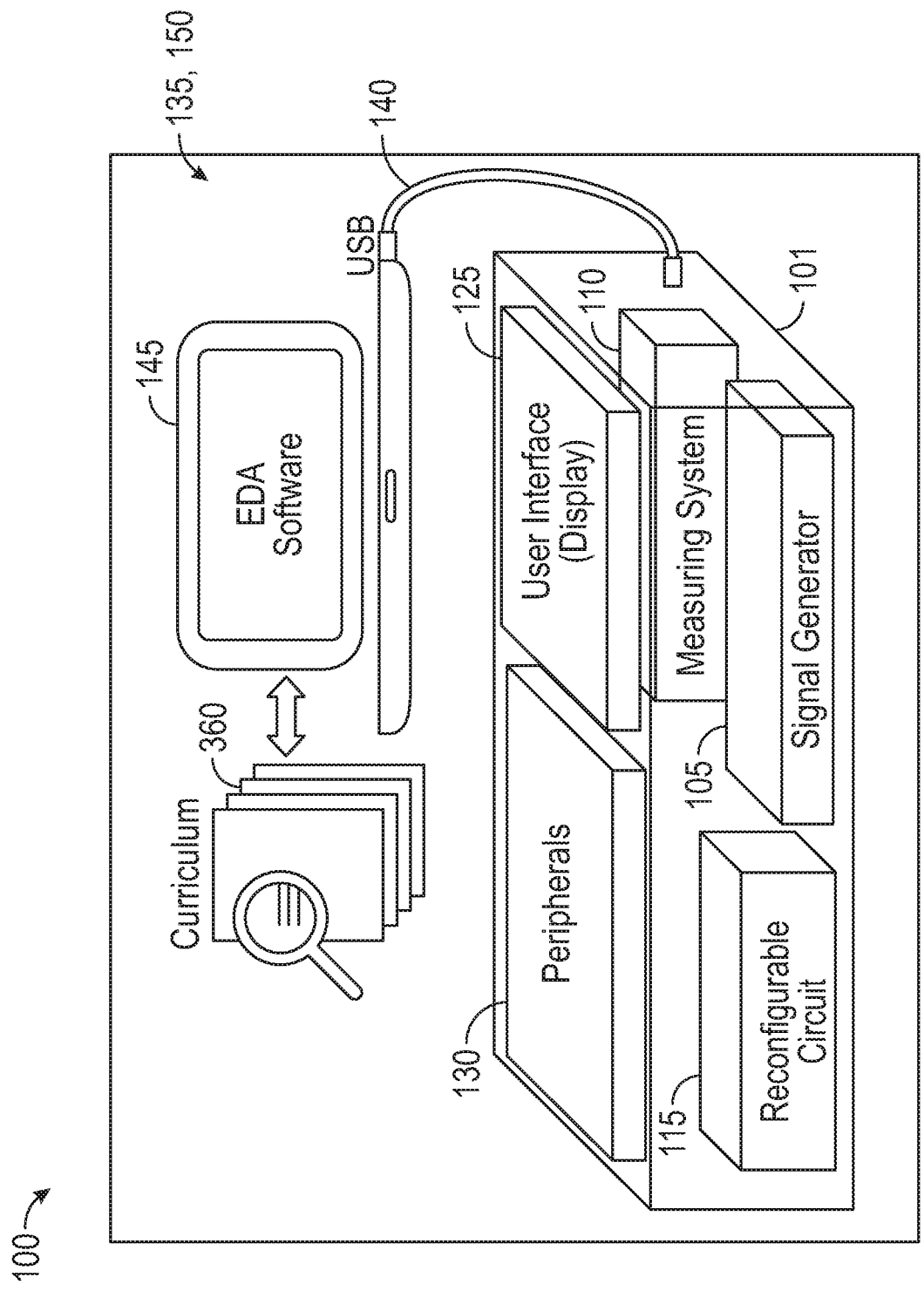
FIG. 3 illustrates a schematic diagram of an electronics personal laboratory including an electronics personal laboratory module contained in a compact unitary package, in accordance with an example embodiment.

As shown in FIG. 3, electronics personal laboratory 100, or electronics personal laboratory module 101 comprising a significant portion of electronics personal laboratory 100, may be contained in a unitary (one piece, all-in-one) compact package. Module 101 may include any or all of stimulus generator 105, measurement system 110, the reconfigurable circuit 115, controller 120 (not shown in FIG. 3), user interface 125, and peripherals 130 (elements 125 and 130 are described below), and of course also the electrical connections (e.g., wiring, signal traces, conductive tracks, etc.) between these elements. For example, in some embodiments, module 101 may include stimulus generator 105, measurement system 110, the reconfigurable circuit 115, controller 120, and user interface 125 (and the electrical connections among these elements); in some embodiments, module 101 may include these elements and peripherals 130 (and the electrical connections among these elements). In some example embodiments, module 101 may have the form factor of a tablet computer, which accommodates an ergonomic user interface 125, including, e.g., a display/touch screen for displaying graphical output and accepting input via touch screen.

With continued reference to FIGS. 1 and 3, the electronics personal laboratory 100 can also include a computer device 135. Computer device 135 may be a laptop computer, desktop computer, tablet, smartphone, or other processor-based device, whether portable or not, including appropriate processor and memory components. Computer device 135 may be connected to electronics personal laboratory module 101 by a communication bus 140. In some embodiments, communication bus 140 may be a USB cable connection or other wired connection. In some example embodiments, computer device 135 may be connected to electronics personal laboratory module 101 wirelessly.

Electronics personal laboratory 100 may also include software 145, such as electronic design automation (EDA) software, which may be loaded onto computer device 135 or otherwise made accessible to computer device 135. Computer device 135 may also include a user interface 150 (e.g., a graphical user interface (GUI) and a keyboard) permitting a user to use the software 145 to configure and reconfigure the reconfigurable circuit 115. As mentioned, module 101 may also include a user interface 125. User interfaces 125 and 150 may be referred to collectively as the user interface for electronics personal laboratory 100. In various embodiments, electronics personal laboratory 100 may include either one or both of user interfaces 125 and 150. User interface 125 may be electrically and operatively connected to module 101 and computer device 135, e.g., via controller 120 as shown in FIG. 1, although other connection arrangements are possible as will be understood by one of ordinary skill in the art.

In some embodiments, a user may use the electronics personal laboratory via the user interface 125, and also access and use the software 145 (which may be resident on computer device 135) via the user interface 125. If desired, a user may design, construct, test, and evaluate circuits solely using module 101, or solely remotely from computer device 135, thus permitting the user to be extremely mobile. The user may also be extremely mobile where computer device 135 is a smartphone, tablet, or similarly mobile device, even when the user uses software 145 via user interface 150 of (mobile) computer device 135.

Computer device 135 may also be understood generally as an electronic device comprising memory (e.g., read-only memory (ROM), random access memory (RAM), hard drive/solid state drive/flash memory, etc.) and one or more processors operably coupled to the memory. Computer device 135 may also include a network interface, among other components. Software 145 may comprise instructions stored in, or capable of being loaded in, the memory (e.g., read-only memory (ROM), random access memory (RAM), hard drive/solid state drive/flash memory, etc.) and executable on the processor(s) to perform operations.

Let us return to the issue of how the user creates and undoes the connections between circuit elements in the reconfigurable circuit 115, in order to construct, dissemble, and recreate circuits. As mentioned, software 145 may be electronic design automation (EDA) software. Using such software, a user, e.g., a student, may design a circuit using interface 150 (e.g., GUI) of computer 135 or interface 125 of module 101. For example, in designing a circuit, a user may select given circuit elements and indicate electrical connections to be established between the selected circuit elements. The EDA software 145 may use nodes to encode the electrical connections that are to be established between elements.

Each software node may represent a hardware node, that is, an interconnection point between two or more circuit elements or a connection point (e.g., terminal) of a circuit element. In response to user input, a software node may be designated as a node for which an electrical connection is to be established or not. For example, where a user instructs to connect a power supply, resistor, and capacitor in parallel, the software may represent this by a node having these three elements (one terminal of each of these three elements) connected to it.

The completed user-designed circuit may be captured by the EDA software in a schematic (circuit diagram). The completed user-designed circuit captured by the EDA software in a schematic may be stored in nonvolatile or volatile memory in the computer 135. The EDA software may then cause the schematic to be converted into a real, physical circuit made up of real, physical circuit elements. To do this, the software may send instructions to controller 120, causing, a physical circuit corresponding to the schematic to be constructed by the reconfigurable circuit 115. The physical circuit is constructed, that is, the reconfigurable circuit 115 is configured (or, after having been initially configured, reconfigured) into the physical circuit by establishing electrical connections between the appropriate circuit elements of the reconfigurable circuit 115.

The electrical connections are established by using the MEMS or semiconductor switches, as described above, or by programming the FPAA, depending on how the reconfigurable circuit 115 is constituted. In this way, the physical circuit designed by the user may be created in an automated manner, rather than the user having to create the physical circuit manually by connecting the circuit elements with wiring by hand. Once the reconfigurable circuit 115 has been configured in a certain manner (a certain circuit constructed), the user may use EDA software 145 to reconfigure the reconfigurable circuit 115 into a different physical circuit. Dissembling a physical circuit and creating a new physical circuit may likewise be performed in an automated manner. Thus, EDA software 145 permits automation of the entire configuration/reconfiguration process, i.e., automated reconfigurability.

In terms of the general description of computer device 135 and software 145 given above, EDA software 145 may include instructions that are stored in, or capable of being loaded in, the memory (e.g., read-only memory (ROM), random access memory (RAM), hard drive/solid state drive/ flash memory, etc.) and that can be executed on the processor to perform operations comprising: allowing a user to design a circuit by selecting circuit elements and indicating electrical connections to be established between the selected circuit elements; and causing the designed circuit to be physically realized by the reconfigurable circuit 115. As will be appreciated by one of ordinary skill in the art in view of this disclosure, these operations could be further elaborated or detailed along the lines of the above description of EDA software 145. These operations are included n the aforementioned configuration mode of the electronics personal laboratory 100.

The user interface (125 and/or 150) may be generally described as configured or permitting a user to (A) interact with the software 145 to design a circuit by selecting circuit elements and indicating electrical connections to be established between the selected circuit elements, (B) cause the signal generator 105 to apply a stimulus to the reconfigurable circuit 115, and (C) receive indication of a response to an applied stimulus, the response generated by the reconfigurable circuit 115 and obtained by the DAQ 110. The user interface (125 and/or 150) may comprise a display or GUI (with or without touch screen functionality), as mentioned above, and/or other kinds of input and/or output devices, e.g., a keyboard, mouse, microphone, printer, audio speaker, LED or other light-producing output, etc. (of course, in some embodiments, only certain particular types of user interface devices may be employed for user interface 125 in order to facilitate both good ergonomics and a high degree of compactness and mobility of module 101).

One advantage of the automated circuit construction is that it eliminates the problem, discussed above, of wiring errors (wrong connections) in the circuit/system being developed. As mentioned, wiring errors may be difficult, time-consuming, and frustrating to find, and the process of correcting wiring errors does not have significant educational value. This may improve the learning process and make the learning process more efficient by eliminating unproductive time and effort directed to correcting wiring mistakes. Instead, more student time can be focused on learning and understanding circuit behavior, with an eye to circuit design.

As will be understood from the foregoing description, the automated reconfigurability facilitates and promotes student learning by trial and error and tinkering with different circuit configurations. Relatedly, engineering controls may be incorporated into electronics personal laboratory 100 in order to protect the user, e.g., a student, and the equipment, i.e., the various components of electronics personal laboratory 100, such as the circuit elements. For example, such controls may prevent conditions that would damage or overly stress electronics personal laboratory 100. This may be achieved, e.g., by installing internal circuitry (which may include controlling devices, such as fuses, etc.) in electronics personal laboratory 100 that prevents certain combinations of circuit elements from being physically constructed, and/or prevents certain tests from being carried out, e.g., prevents certain inputs/stimuli from being applied (e.g., a current or voltage exceeding a threshold). This internal circuitry may be included in and/or implemented/managed by controller 120, as mentioned above. For learning purposes, electronics personal laboratory 100 may be designed so that the user is permitted to make such mistakes (i.e., that would damage electronics personal laboratory 100) in the stage of designing a circuit, but the system 100 prevents such mistakes from being physically realized in the actual hardware. As noted above, these safety controls may limit the freedom provided to the user to connect circuit elements and (re)configure circuits.

Software 145 may include, in addition to software for designing circuits (discussed above), software for testing circuits. This software for testing circuits may be operable to instruct the pertinent hardware (e.g., stimulus generator 105) to apply a stimulus to a circuit under test and (e.g., measurement system 110) to determine the response of the circuit under test to the applied stimulus, and thence to analyze circuit behavior and performance. In this regard, different kinds of stimuli may be applied to a given circuit under test, and different kinds of responses from different parts of the circuit under test may be determined. For example, the voltage potential at the circuit nodes may be measured and/or the electric current flowing through the different circuit branches may also be measured.

Since the circuit elements and the electrical connectors are included in electronics personal laboratory 100 (built in to the reconfigurable circuit 115), the properties of the circuit elements and the electrical connectors are known in advance (discussed below), and this may permit, at least under certain circumstances, the software 145 to simulate circuit behavior/performance including parasitic resistances and capacitances of the circuit elements and electrical connectors even without actual testing (applying stimulus and measuring response). The software 145 may also evaluate behavior/performance of the actual circuit including parasitic resistances and capacitances of the circuit elements and electrical connectors. For example, software 145 may be able to evaluate the designed circuit and/or the constructed circuit and determine if it satisfies the design criteria or solves the design problem assigned to a student.

In some embodiments, the capacity to test circuits may be provided in module 101, such that a user could use module 101 for that purpose, separately from computer device 135. This testing capacity may be provided by hardware or firmware in module 101 or in computer device 135, or by software that is physically and/or logically a part of or separate from software 145. (As will be understood from the above description, computer device 135 may be physically separable/separated from module 101.) In this regard, user interface 125 on module 101 might be advantageous for a user to employ in the process of testing circuits, e.g., where module 101 is highly mobile and computer device 135 is relatively less mobile. On the other hand, user interface 150 on computer device 135 may be particularly useful for a user in the process of designing circuits, e.g., where computer device 135 provides a large display screen and module 101 is rendered small for purposes of compactness and mobility, thus affording room for only a small user interface 125 and associated display.

Peripherals 130 refer to one or more hardware devices that are configured to have a physical effect in the real world and that are configured to be activated or deactivated by the circuit created by the reconfigurable circuit 115. Activation of peripheral device 130 causes peripheral device 130 to produce the real world physical effect. Peripherals 130 may include hardware such as actuators, sensors, speakers, displays, lights, etc., which may generate motive, audio, visual, or other effects. Peripherals 130 thus may also be understood as output devices, that is, devices operated by the circuit to provide a real world output. As shown in FIG. 1, peripherals 130 may be electrically and operatively connected to the reconfigurable circuit 115. In some embodiments, electronics personal laboratory 100 does not include peripherals 130.

It will be noted that electronics personal laboratory 100 generates a real, physical circuit that is operable to produce real world, physical effects, not merely a (e.g., computer) simulation of a circuit with simulated effects. This permits a student to gain an entirely different and deeper level of understanding than can be had with simulation models. Real circuit elements and electrical connectors, and hence the circuits made from them, have their own intrinsic properties, which are dependent on the natural, constitutive, physical properties of the matter of which they are made. Because of this, the real world behavior of a circuit and its component elements often includes effects not intended or desired with respect to the intended functionality of the circuit and its elements.

Accordingly, the circuit's/element's real world behavior does not exactly match the theoretical prediction of its behavior based on its intended functionality. Engineering models (simulations) frequently do not take account of all of these physical properties of circuits/elements and hence do not perfectly capture or generate their real world behavior. A student can compare the circuit behavior generated by a real circuit of electronics personal laboratory 100 with the simulated behavior of a simulated circuit and see that the two behaviors are different and investigate and come to understand the nature of and reasons for the differences. In this way, a student can appreciate the limitations of theoretical models and simulations of circuits and, furthermore, can gain an understanding of the physics of semiconductors, not merely learn how to design, test and evaluate circuits.

More specifically, using electronics personal laboratory 100, a student may gain an understanding of parasitic effects (e.g., capacitance, resistance, inductance) and third-level parameters (e.g., carrier concentrations, mobilities and lifetimes) of circuits, as well as an understanding of current and power management. As noted above, EDA software 145 effectively knows the geometries and intrinsic properties of the circuit elements and the electrical connectors of the reconfigurable circuit 115 that underlie these parasitic effects, third-level parameters, and behavior under varying conditions of power loading and the like.

As mentioned above, the difference between real world and simulated circuit behavior is one reason why the process of reconfiguration/iteration, trial and error is an important part of the circuit development and testing process, as well as of the associated learning process.

As mentioned, electronics personal laboratory 100 affords users (e.g., students) experience in designing, constructing, testing, and evaluating the performance of actual, real world, hardware circuits rather than merely simulations. Nonetheless, electronics personal laboratory 100 retains various advantages of systems for creating and testing simulated circuits. For example, with electronics personal laboratory 100, a user can build and test actual circuits without having to physically contact and manipulate the circuit elements and the wires or other conductors, switches, etc. This is due to the fact that electronics personal laboratory 100 (software 145 instructing the reconfigurable circuit 115 via controller 120) causes physical construction of the circuit. This eliminates the problem of wiring errors and the time, effort, and frustration involved in correcting them, which has little educational value, as discussed above.

As another example, electronics personal laboratory 100 provides a platform for design, construction, testing, and evaluation of the performance of actual circuits, which platform is very small and compact, and hence highly portable or mobile. This facilitates delivery of the lab equipment to many users, e.g., students, who would not have access to a lab at all (e.g., distance/remote learners, and other students who are not able to attend a lab course at the physical location of the school or educational institution) or who would have limited opportunity for individual hands-on lab experience (e.g., in an ordinary classroom, where there is only one lab setup serving multiple students, due to cost, space, and maintenance supervision requirements).

As another example, electronics personal laboratory 100 is a self-contained, all-in-one kit, containing everything a user needs to design, construct, test, and evaluate the performance of circuits. The user does not need to obtain or provide any external equipment. This also facilitates delivery to a broader swath of users, e.g., users who in various circumstances would not realistically be able to provide (and, e.g., connect) such external equipment, e.g., due to lack of resources, opportunity/access, ability, knowledge, etc. Thus, while electronics personal laboratory 100 may seem counterintuitive in that it provides a hands-on lab, experience that is less hands-on than a traditional hands-on lab experience, this very fact also provides numerous advantages, such as discussed herein, which permit wider distribution of lab equipment and provision of opportunity for lab-based scientific and engineering education to a much wider swath of the population. This may promote scientific and engineering literacy and education, which in turn may serve the public good by: (1) increasing the supply of workers with appropriate science/engineering/technology education needed to fill the increasing numbers of positions needed as technology advances and becomes more pervasive in society, as well as (2) providing for a more scientifically/technically educated citizenry that can better understand and act on issues involving technology that they encounter in the realm of public policy or that they face in their daily lives.

Since, as mentioned, EDA software 145 may be used to test and evaluate circuits constructed by students and analyze their performance, EDA software 145 may also permit automated evaluation of students' work in circuit design and analysis. This automation of evaluation, in turn, should make it easier for the instructor to teach a larger number of students. It may also improve the learning process and further lessen the teaching burden. For example, problems having only a single degree of freedom are of limited educational value to the student. While problems with a greater number of degrees of freedom permit more design flexibility and are more challenging and educational for the students, such problems are more difficult for the instructor to grade.

By providing automated evaluation, the EDA software 145 may facilitate the assigning of problems with increased degrees of freedom. The automated evaluation provided by the EDA software 145 should also facilitate assigning variations of the same problem to different students, which may reduce cheating and thus promote a high level of academic integrity. The automated evaluation provided by the EDA software 145 may also support a self-teaching module/mode whereby the student can use the software 145 to learn independently at an appropriate pace for the particular student. The student will be able to receive evaluation of his or her work from the software 145 so as to know if the material has been mastered and to know when it is appropriate to start learning new material.

Figure 4:
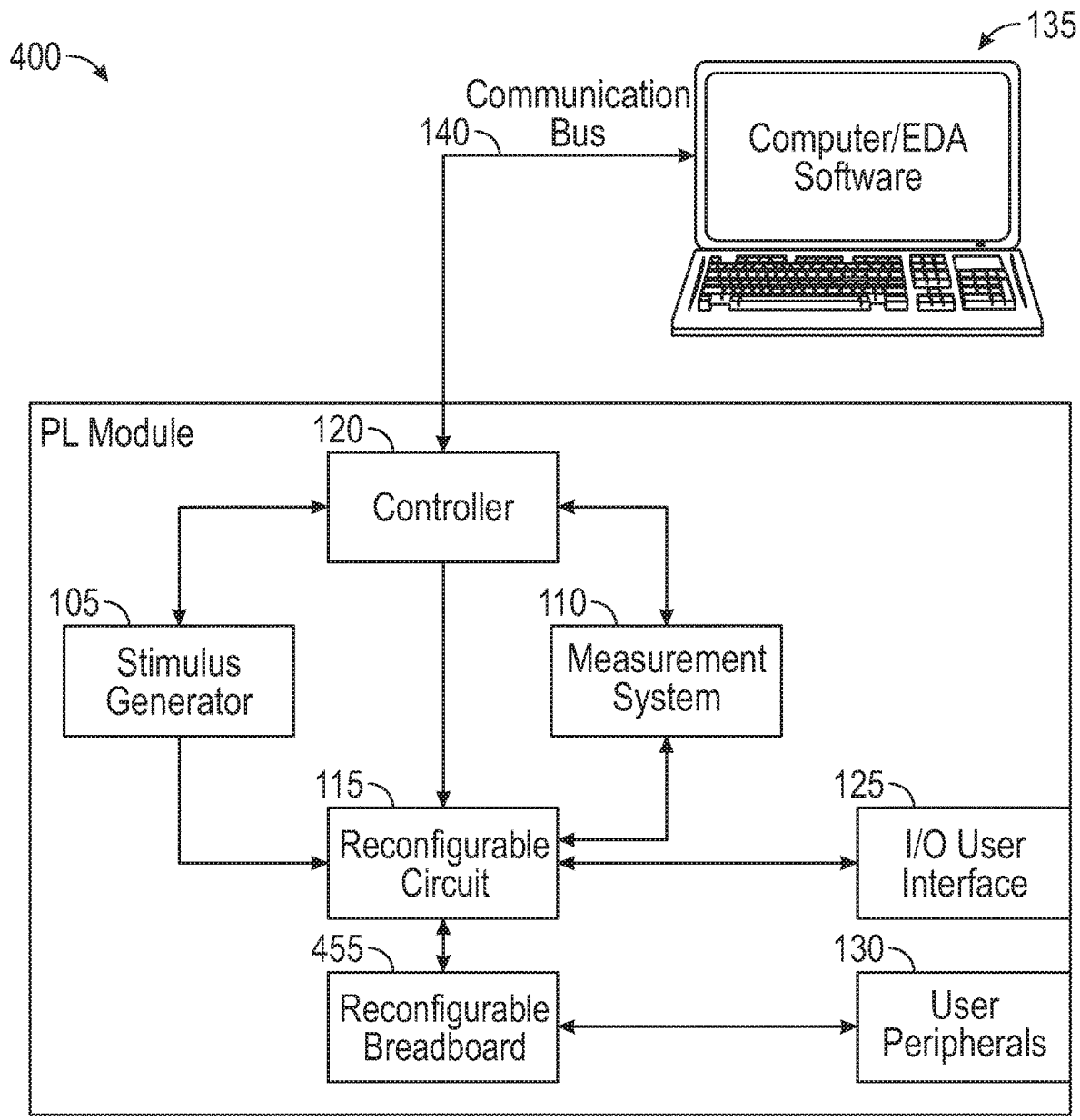
FIG. 4 illustrates a block diagram of an electronics personal laboratory including a breadboard in accordance with an example embodiment.

FIG. 4 illustrates a block diagram of an electronics personal laboratory 400 including a breadboard, in accordance with an example embodiment. FIG. 4 is identical to FIG. 1 except that electronics personal laboratory 400 shown in FIG. 4 includes an additional element, namely, a reconfigurable breadboard 455, operatively connected to the reconfigurable circuit 115 and peripherals 130 and disposed operatively therebetween. In some embodiments, reconfigurable breadboard 455 is operatively connected to the reconfigurable circuit 115 and not to peripherals 130. As with electronics personal laboratory 100, in some embodiments, electronics personal laboratory 400 does not include peripherals 130.

Reconfigurable breadboard 455 may provide expandability and design flexibility, permitting additional circuit structure and functionality to be added to the circuit constructed using the reconfigurable circuit 115. For example, via reconfigurable breadboard 455, a computer chip or other kind of chip or the like may be effectively included in the circuit that is constructed using the reconfigurable circuit 115. Such a chip could be electrically connected to the circuit and effectively incorporated into the circuit. The pins or electrical terminals of reconfigurable breadboard 455 may be appropriately connected to reconfigurable circuit 115, such that the EDA software 145 can control those connections. That is, EDA software 145 may be configured to be able to establish (via instruction sent via controller 120) an electrical connection between (the circuit constructed on) the reconfigurable circuit 115 and an element (e.g., identified as being located at a particular location) on reconfigurable breadboard 455. Thus, by using reconfigurable breadboard 455, electronics components much more complex than those included in the bank 202 of circuit elements of the reconfigurable circuit 115 can effectively be included in the circuit constructed from the reconfigurable circuit 115.

As another example, since the bank 202 of circuit elements necessarily includes only a finite number of circuit elements, if the user requires additional circuit elements beyond those included in bank 202 of circuit elements of reconfigurable circuit 115, such additional circuit elements could be added via reconfigurable breadboard 455. In some embodiments, reconfigurable breadboard 455 may include such additional elements (that is, the more complex electronics components and/or the additional more basic circuit elements), while in other embodiments reconfigurable breadboard 455 may not include them and the user may provide them and use them with reconfigurable breadboard 455. Reconfigurable breadboard 455 may also include electrical connectors for connecting such additional electrical elements.

As another example, reconfigurable breadboard 455 may include circuit elements and electrical connectors (e.g., standard electrical connectors for a breadboard), similarly to reconfigurable circuit 115, but using electrical connectors configured for easy/traditional manual use, and may provide users with the opportunity for a more hands-on experience of circuit construction. That is, according to this example, reconfigurable breadboard 455 may allow users to create a circuit manually on reconfigurable breadboard 455, manually connecting elements using wiring or the like in order to gain experience in manual circuit construction.

As another example, reconfigurable breadboard 455 may provide a more convenient or flexible platform for connecting peripherals 130 to the reconfigurable circuit 115.

Regardless of the application to which reconfigurable breadboard 455 is put, circuit combinations and configurations involving reconfigurable breadboard 455 may not only be created but also taken apart and reconstructed/reconfigured. In this regard, reconfigurable breadboard 455 may be constructed along the lines of the reconfigurable circuit 115 (e.g., using a type of electrical connectors employed in the reconfigurable circuit 115) so as to provide for automated configuring, dissembling, and reconfiguring, or it may be constructed otherwise (e.g., using electrical connectors standard for a traditional breadboard that can be used manually) to provide for manual or less automated configuring, dissembling, and reconfiguring.

Figure 5:
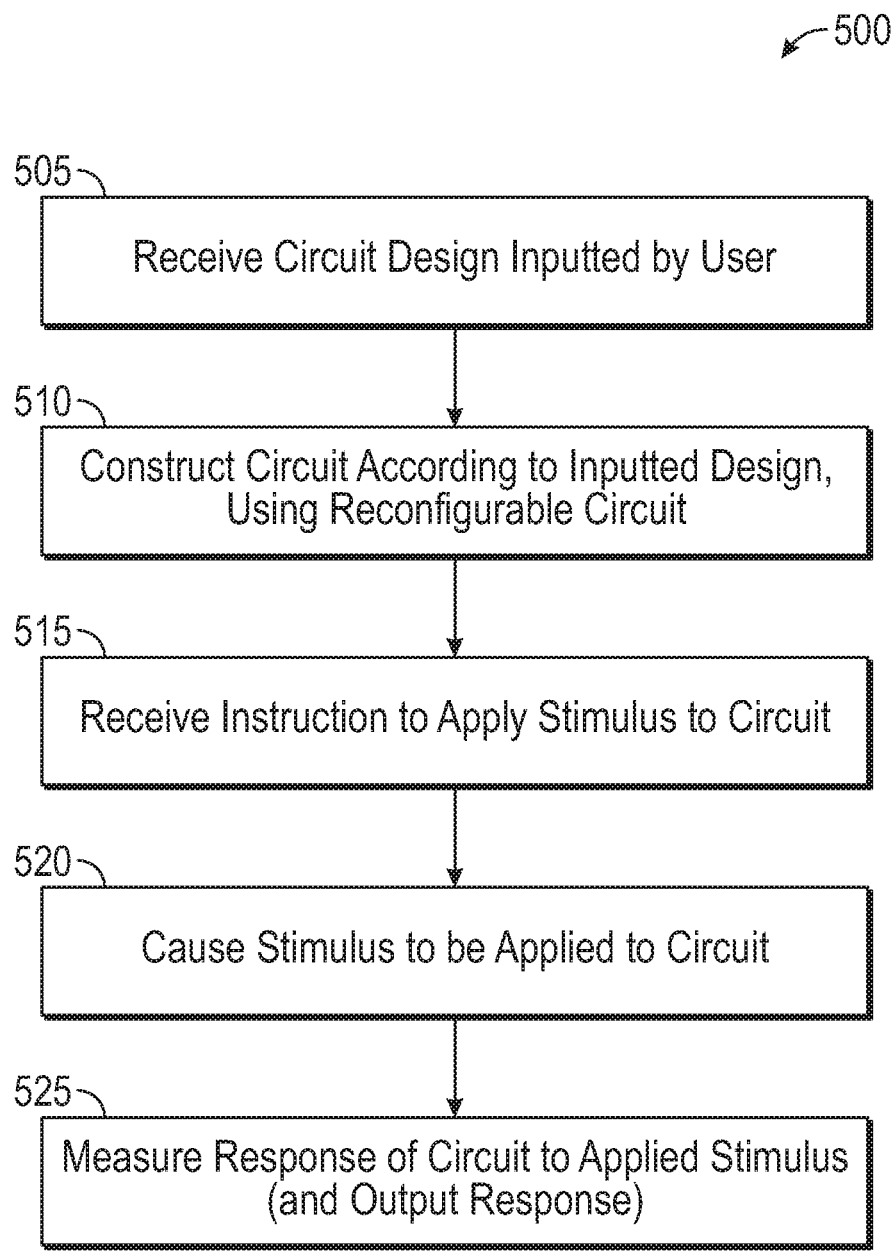
FIG. 5 illustrates a flow chart of operations illustrating logical operational steps of a method of using an electronics personal laboratory, in accordance with an example embodiment.

FIG. 5 illustrates a flow chart of operations illustrating logical operational steps of a method 500 of using an electronics personal laboratory such as disclosed herein, in accordance with an example embodiment. It will be understood that details of method 500 not explicitly set forth in this description of FIG. 5 may be found elsewhere in the instant disclosure. As indicated at block 505, the computer device 135 can receive a circuit design (schematic) inputted by a user. The circuit design may be created as described above with reference to EDA software 145. The user may input the design piecemeal, e.g., selecting given circuit elements, connecting given circuit elements, and so on. The computer device 135 may perform the operation shown at block 505 of receiving the circuit design by receiving such piecemeal user instructions and generating a complete schematic based on the piecemeal instructions.

As depicted at block 510, the EDA software 145 can instruct the controller 120 to cause a circuit according to the inputted design to be constructed, using the reconfigurable circuit 115. For example, the MEMS or semiconductor switches are closed, or the FPAA is programmed, to form the applicable electrical connections between the circuit elements needed to construct the circuit. As shown at block 510, safety controls may be implemented such as to prevent connections of elements and constructions of circuits that would endanger user safety or cause damage to the equipment.

As depicted at block 515, the electronics personal laboratory 100 can receive an instruction to apply a stimulus to the constructed circuit. This instruction may be received from a user via user interface 125 or 150, and may or may not be implemented via software 145, depending on how electronics personal laboratory 100 is constructed. In some example embodiments, this step or operation may be automated (and the instruction not received via user interface 125 or 150), e.g., electronics personal laboratory 100 may be programmed to automatically apply a standard stimulus, or a custom stimulus determined based on the specific circuit constructed, once a circuit is constructed. In some example embodiments, the user may be given the option to turn on and off this automation.

As shown at block 520, the stimulus generator 105 (e.g., signal generator) can be caused by applicable hardware/firmware/software of electronics personal laboratory 100 to apply a stimulus (e.g., a voltage or current) to the circuit. In response to the applied stimulus, the circuit behaves in a certain manner (responds to the stimulus). As illustrated thereafter at block 525, the measurement system 110 (e.g., DAQ) measures/obtains the response of the circuit (or the response of the portion of the circuit) to the applied stimulus. The response, or an indication thereof, may be outputted, e.g., displayed on user interface 125 or 150, or in another fashion. In some example embodiments, an instructor may create an assignment or series of assignments 360 (shown in FIG. 3) with circuit design/analysis problems and input the assignment 360 into the EDA software 145 for a student user to solve. As the EDA software 145 may be configured to determine or analyze the performance of the circuit constructed by the student, the EDA software 145 may be configured to grade the assignment 360 after the student user completes the assignment 360 using the EDA software 145.

In method 500, the operations or steps shown at block 505 and 510 may be included in the aforementioned configuration mode of a personal electronics laboratory, while the operations or steps depicted at block 515-525 may be included in the aforementioned testing mode of a personal electronics laboratory. Likewise, portions of software 145, firmware, and hardware for performing respective steps 505 and 510 may be deemed to operate in the configuration mode, while portions of software 145, firmware, and hardware for performing respective steps shown at blocks 515-525 may be deemed to operate in the testing mode. A personal electronics laboratory may be configured to have sub-modes of the configuration and testing modes, or to have different modes altogether (for example, the operations described with reference to FIG. 5/method 500 and the operations described elsewhere in this disclosure could be grouped into different modes, according to the nature of the respective operations).

Although the foregoing description focused primarily on an electronics personal laboratory, the underlying principles of a personal laboratory (e.g., miniaturizing and integrating lab apparatus into integrated chips or the like, provided in a single package, with the features of flexible interconnectability and automated reconfigurability) may be applied to other disciplines to teach a wide variety of scientific and engineering principles. For example, micromechanical devices such as cantilevers, gears, and other machines, which are already miniature, may be integrated with the MEMS or semiconductor switches to make a mechanics personal laboratory. Another example would be to combine electronic elements with micromechanical devices to create a mechatronics personal laboratory. In this way, the concept of a personal laboratory may be applied to a wide range of scientific and engineering disciplines including but not limited to electronics, electromagnetics, mechanics, optics, fluidics, sensors, actuators, biology, chemical/chemistry, combinations of the preceding, and other disciplines.

In addition to the disciplinary and multidisciplinary applications discussed above, the personal laboratories have great potential for supporting novel interdisciplinary approaches. For example, by interconnecting different kinds of personal laboratories using a master MEMS or semiconductor relay unit, advanced interdisciplinary capabilities may be achieved. An example would be to combine electronics, mechanics, and optics personal laboratories. Other advanced versions of the personal laboratories could incorporate advanced nanoscale devices, such as tunneling field-effect transistors, memristors, or spin transfer torque devices, for example.

In the other (i.e., non-electronics/circuits/electrical engineering) disciplinary applications and the cross-disciplinary applications described above, the stimulus generators and measuring systems would be matched to the physical phenomena and engineering principles involved. For example, in a heat-conduction experiment, where the device under test (analogous to the circuit in the electronics personal laboratory) is a device conducting heat, the stimulus generator may be a device that generates heat and the measurement system may be a sensor that measures temperature. As for the electronics personal laboratory, so too for personal laboratories in other disciplines, the stimulus generators that generate the physical stimulus (e.g., electrical signals, mechanical stimuli, thermal stimuli, or other physical stimuli) and the measurement systems that measure the physical responses (e.g., voltage, current, pressure, force, displacement, temperature, or other physical parameters) may also be miniaturized.

As discussed above, a personal laboratory applicable to one or more disciplines other than electronics may be generically described as follows. Such a personal laboratory may include: (1) a reconfigurable system, the reconfigurable system comprising (A) a plurality of functional components, and (B) a plurality of connectors configured for operatively connecting respective ones of the plurality of functional components to other ones of the plurality of functional components; (2) a stimulus generator configured to apply a stimulus to the reconfigurable system; and (3) a measurement system configured to measure a response to the applied stimulus generated by the reconfigurable system. With respect to such a personal laboratory, the reconfigurable system may be selected from one or a combination of the following types of systems: electrical, magnetic, mechanical, optical, fluid, thermal, sensor, actuator, biological, chemical/chemistry, or other types of systems. In such a personal laboratory, the functional components may comprise micromechanical devices or (an) other type(s) of devices.

In light of the principles and example embodiments described and illustrated herein, it will be recognized that the example embodiments can be modified in arrangement and detail without departing from such principles. Also, the foregoing discussion has focused on particular embodiments, but other configurations are also contemplated. In particular, even though expressions such as "in one embodiment," "in another embodiment," or the like are used herein, these phrases are meant to generally reference embodiment possibilities and are not intended to limit the invention to particular embodiment configurations. As used herein, these terms may reference the same or different embodiments that are combinable into other embodiments. As a rule, any embodiment referenced herein is freely combinable with any one or more of the other embodiments referenced herein, and any number of features of different embodiments are combinable with one another, unless indicated otherwise or so dictated by the description herein.

Similarly, although example methods or processes have been described with regard to particular steps or operations performed in a particular sequence, numerous modifications could be applied to those methods or processes to derive numerous alternative embodiments of the present invention. For example, alternative embodiments may include methods or processes that use fewer than all of the disclosed steps or operations, methods, or processes that use additional steps or operations, and methods or processes in which the individual steps or operations disclosed herein are combined, subdivided, rearranged, or otherwise altered. Similarly, this disclosure describes one or more embodiments wherein various operations are performed by certain systems, applications, modules, components, etc.

In alternative embodiments, however, those operations could be performed by different components. Also, as will be understood by one of ordinary skill in the art, certain items such as applications, modules, components, etc., may be implemented as software constructs stored in a machine accessible storage medium, such as an optical disk, a hard disk drive, etc., and those constructs may take the form of applications, programs, subroutines, instructions, objects, methods, classes, or any other suitable form of control logic; such items may also be implemented as firmware or hardware, or as any combination of software, firmware, and hardware, or any combination of any two of software, firmware, and hardware. The term "processor" may refer to one or more processors.

As can be appreciated by one skilled in the art, embodiments can be implemented in the context of a method, data processing system, or computer program product. Accordingly, embodiments may take the form of an entire hardware embodiment, an entire software embodiment, or an embodiment combining software and hardware aspects all generally referred to herein as a "circuit" or "module." Furthermore, embodiments may, in some cases take the form of a computer program product on a computer-usable storage medium having computer-usable program code embodied in the medium. Any suitable computer readable medium may be utilized including hard disks, USB Flash Drives, DVDs, CD-ROMs, optical storage devices, magnetic storage devices, server storage, databases, etc.

Computer program code for carrying out operations of the present invention may be written in an object-oriented programming language (e.g., Java, C++, etc.). The computer program code, however, for carrying out operations of particular embodiments may also be written in conventional procedural programming languages, such as the "C" programming language or in a visually oriented programming environment, such as, for example, Visual Basic.

The program code may execute entirely on the user's computer, partly on the user's computer, as a stand-alone software package, partly on the user's computer and partly on a remote computer, or entirely on the remote computer. In the latter scenario, the remote computer may be connected to a user's computer through a local area network (LAN) or a wide area network (WAN), wireless data network e.g., Wi-Fi, Wimax, 802.xx, and cellular network, or the connection may be made to an external computer via most third party supported networks (for example, through the Internet utilizing an Internet Service Provider).

The embodiments are described at least in part herein with reference to flowchart illustrations and/or block diagrams of methods, systems, and computer program products and data structures according to embodiments of the invention. It will be understood that each block of the illustrations, and combinations of blocks, can be implemented by computer program instructions. These computer program instructions may be provided to a processor of, for example, a general-purpose computer, special-purpose computer, or other programmable data processing apparatus to produce a machine, such that the instructions, which execute via the processor of the computer or other programmable data processing apparatus, create means for implementing the functions/acts specified in the block or blocks. To be clear, the disclosed embodiments can be implemented in the context of, for example, a special-purpose computer or a general-purpose computer, or other programmable data processing apparatus or system. For example, in some embodiments, a data processing apparatus or system can be implemented as a combination of a special-purpose computer and a general-purpose computer.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the various block or blocks, flowcharts, and other architecture illustrated and described herein.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 6:
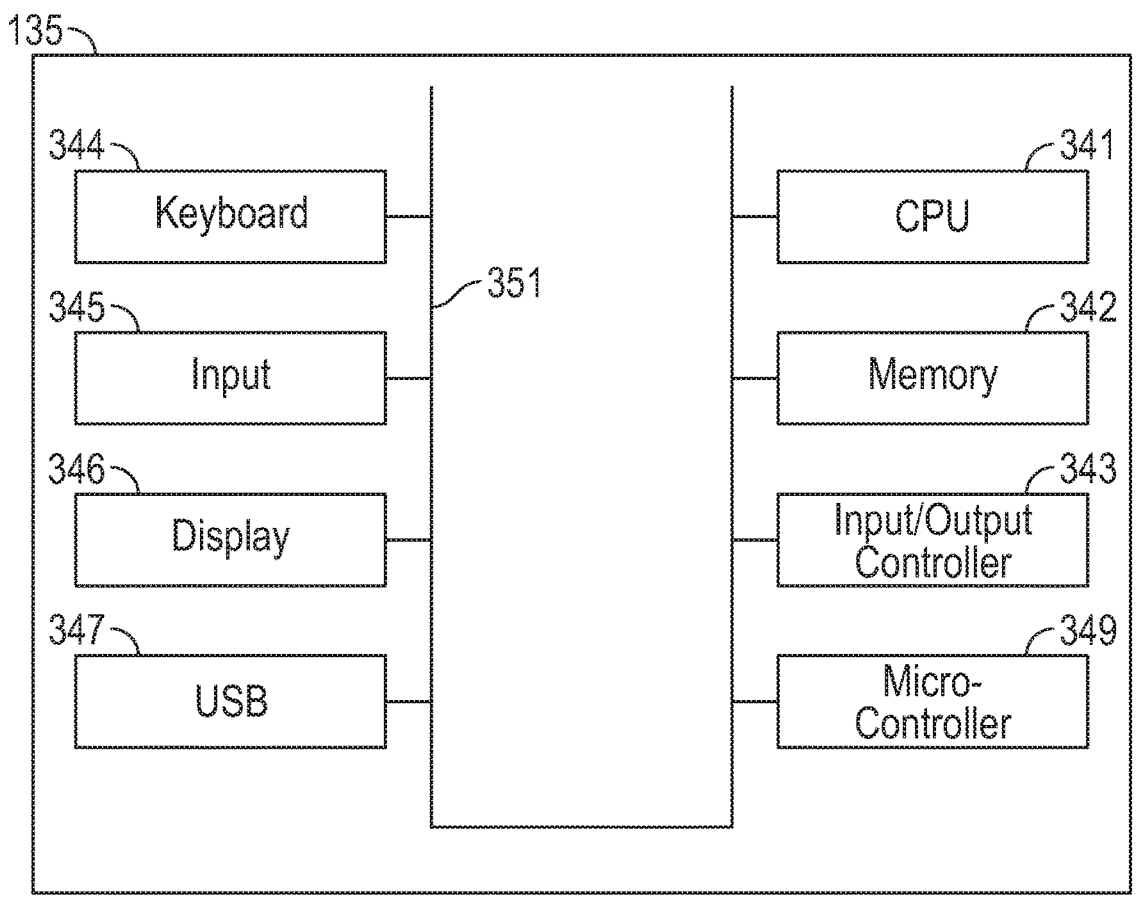
FIG. 6 illustrates a schematic view of a computer system/apparatus, which can be adapted for use in accordance with an example embodiment.
Figure 7:
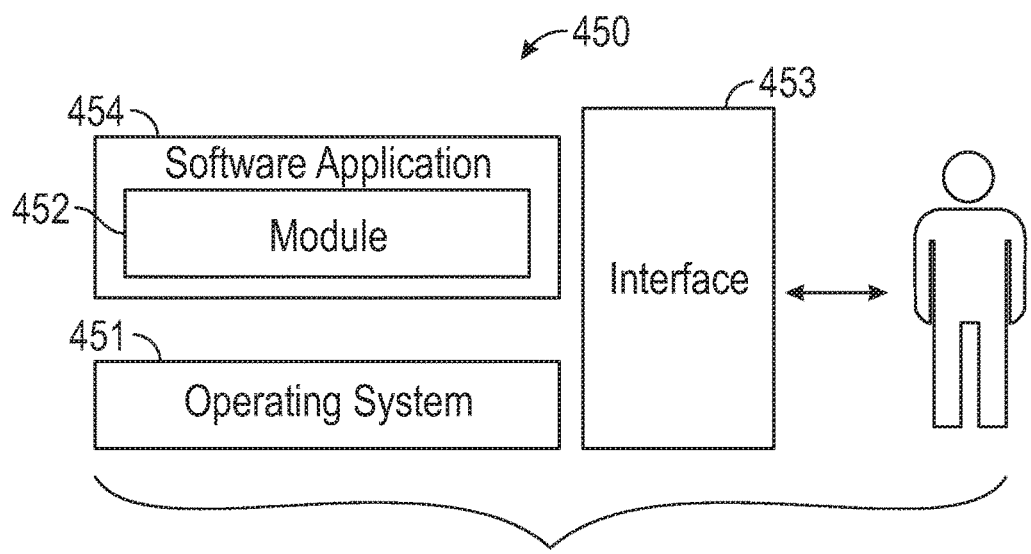
FIG. 7 illustrates a schematic view of a software system including a module, an operating system, and a user interface, in accordance with an embodiment.

FIGS. 6-7 are shown only as exemplary diagrams of data-processing environments in which example embodiments may be implemented. It should be appreciated that FIGS. 6-7 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments.

As illustrated in FIG. 6, some embodiments may be implemented in the context of a data-processing system/apparatus 135 that can include, for example, one or more processors such as a processor 341 (e.g., a CPU (Central Processing Unit) and/or other microprocessors), a memory 342, an input/output controller 343, a microcontroller 349, a peripheral USB (Universal Serial) Bus) connection 347, a keyboard 344 and/or another input device 345 (e.g., a pointing device, such as a mouse, track ball, pen device, etc.), a display 346 (e.g., a monitor, touch screen display, etc.), and/or other peripheral connections and components. As illustrated, the various components of data-processing system/apparatus 135 can communicate electronically through a system bus 351 or similar architecture. The system bus 351 may be, for example, a subsystem that transfers data between, for example, computer components within data-processing system/apparatus 135 or to and from other data-processing devices, components, computers, etc. The data-processing system/apparatus 135 may be implemented in some embodiments as, for example, a server in a client-server based network (e.g., the Internet) or in the context of a client and a server (i.e., where aspects are practiced on the client and the server).

In some example embodiments, data-processing system/apparatus 135 may be, for example, a standalone desktop computer, a laptop computer, a Smartphone, a pad computing device, and so on, wherein each such device is operably connected to and/or in communication with a client-server based network or other types of networks (e.g., cellular networks, Wi-Fi, etc.).

FIG. 7 illustrates a computer software system/apparatus 450 for directing the operation of the data-processing system/apparatus 135 depicted in FIG. 6. Software application 454, stored for example in memory 342, generally includes a kernel or operating system 451 and a shell or interface 453. One or more application programs, such as software application 454, may be "loaded" (i.e., transferred from, for example, mass storage or another memory location into the memory 342) for execution by the data-processing system/apparatus 135. The data-processing system/apparatus 135 can receive user commands and data through the interface 453; these inputs may then be acted upon by the data-processing system/apparatus 135 in accordance with instructions from operating system 451 and/or software application 454. The interface 453 in some embodiments can serve to display results, whereupon a user may supply additional inputs or terminate a session. The software application 454 can include module(s) 452, which can, for example, implement instructions or operations such as those discussed herein with respect to FIGS. 1-5 herein. Module 452 may also be composed of a group of modules or sub-modules.

The following discussion is intended to provide a brief, general description of suitable computing environments in which the system and method may be implemented. Although not required, the disclosed embodiments will be described in the general context of computer-executable instructions, such as program modules, being executed by a single computer. In most instances, a "module" can constitute a software application, but can also be implemented as both software and hardware (i.e., a combination of software and hardware).

Generally, program modules include, but are not limited to, routines, subroutines, software applications, programs, objects, components, data structures, etc., that perform particular tasks or implement particular data types and instructions. Moreover, those skilled in the art will appreciate that the disclosed method and system may be practiced with other computer system configurations, such as, for example, hand-held devices, multi-processor systems, data networks, microprocessor-based or programmable consumer electronics, networked PCs, minicomputers, mainframe computers, servers, and the like.

Note that the term module as utilized herein may refer to a collection of routines and data structures that perform a particular task or implements a particular data type. Modules may be composed of two parts: an interface, which lists the constants, data types, variable, and routines that can be accessed by other modules or routines; and an implementation, which is typically private (accessible only to that module) and which includes source code that actually implements the routines in the module. The term module may also simply refer to an application, such as a computer program designed to assist in the performance of a specific task, such as word processing, accounting, inventory management, etc. An example of a module is the module 452 shown in FIG. 7 and the PL module discussed previously herein. The PL module may be hardware, software, or a combination thereof.

FIGS. 6-7 are thus intended as examples and not as architectural limitations of disclosed embodiments. Additionally, such embodiments are not limited to any particular application or computing or data processing environment. Instead, those skilled in the art will appreciate that the disclosed approach may be advantageously applied to a variety of systems and application software. Moreover, the disclosed embodiments can be embodied on a variety of different computing platforms, including Macintosh, UNIX, LINUX, and the like.

The claims, description, and drawings of this application may describe one or more of the instant technologies in operational/functional language, for example, as a set of operations to be performed by a computer. Such operational/functional description in most instances can be specifically configured hardware (e.g., because a general purpose computer in effect becomes a special-purpose computer once it is programmed to perform particular functions pursuant to instructions from program software). Note that the data-processing system/apparatus 135 discussed herein may be implemented as special-purpose computer in some example embodiments. In some example embodiments, the data-processing system/apparatus 135 can be programmed to perform the aforementioned particular instructions (e.g., such as the various steps and operations described herein with respect to FIGS. 1-5 thereby becoming in effect a special-purpose computer). In other example embodiments, the data-processing system/apparatus 135 may be a general-purpose computer.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art, which are also intended to be encompassed by the following claims.

What is claimed is:

1. An electronics personal laboratory, comprising:
a reconfigurable circuit, said reconfigurable circuit comprising a plurality of circuit elements and a plurality of electrical connectors configured for electrically connecting any one circuit element of said plurality of circuit elements in more than one configuration to any other circuit element of said plurality of circuit elements;
a signal generator configured to apply a stimulus to said reconfigurable circuit;
a data acquisition system (DAQ) configured to measure a response to said applied stimulus, said response generated by said reconfigurable circuit, wherein at least the signal generator, the data acquisition system (DAQ), and the reconfigurable circuit including the plurality of circuit elements and the plurality of electrical connectors are contained within a unitary package;
a computer device comprising a memory and a processor operably coupled to said memory;
software loaded in said memory and executed on said processor; and
a user interface electrically and operatively connected to the computer device and configured for permitting a user to interact with the software to design a circuit and cause the designed circuit to be built in an automated manner by the reconfigurable circuit including the plurality of circuit elements and the plurality of electrical connectors within the unitary package.

2. The electronics personal laboratory according to claim 1, wherein said plurality of circuit elements comprises at least one of the following: a resistor, an inductor, a capacitor, a transistor, a diode, an operational amplifier, an electrical source, and a meter.

3. The electronics personal laboratory according to claim 1, wherein each of said plurality of electrical connectors is configured for electrically connecting a respective one of said plurality of circuit elements to one or more other ones of said plurality of circuit elements, for electrically disconnecting the respective one of said plurality of circuit elements from the one or more other ones of said plurality of circuit elements, and for electrically reconnecting the respective one of said plurality of circuit elements to the one or more other ones of said plurality of circuit elements.

4. The electronics personal laboratory according to claim 1, wherein said electrical connectors comprise microelectromechanical system (MEMS) relays.

5. The electronics personal laboratory according to claim 1, wherein said electrical connectors comprise semiconductor switches.

6. The electronics personal laboratory according to claim 1, wherein said reconfigurable circuit comprises a field-programmable analog array.

7. The electronics personal laboratory according to claim 1, further comprising:
a controller electrically connected between the computer device and each of the reconfigurable circuit, the signal generator, and the data acquisition system (DAQ), wherein the controller is configured to keep track of whether the electronics personal laboratory is in a configuration mode or a testing mode.

8. The electronics personal laboratory according to claim 1, further comprising a second user interface contained within the unitary package and configured for permitting a user to interact with the software to design the circuit; cause the designed circuit to be built in an automated manner by the reconfigurable circuit including the plurality of circuit elements and the plurality of electrical connectors within the unitary package; cause said signal generator to apply a stimulus to said reconfigurable circuit; and receive indication of a response to an applied stimulus, said response generated by said reconfigurable circuit and obtained by said DAQ.

9. The electronics personal laboratory according to claim 8, wherein said user interface or said second user interface comprises a graphical user interface (GUI).

10. The electronics personal laboratory according to claim 1, further comprising a peripheral device configured to be activated or deactivated by the built circuit formed by said reconfigurable circuit, wherein activation of said peripheral device causes said peripheral device to produce a physical effect.

11. The electronics personal laboratory according to claim 10, wherein said peripheral device comprises at least one of the following: an actuator, a sensor, a display, or a light.

12. The electronics personal laboratory according to claim 1, further comprising a reconfigurable breadboard operatively connected to said reconfigurable circuit.

13. The electronics personal laboratory according to claim 1, further comprising control equipment configured to prevent damage to said circuit elements.

14. A personal laboratory, comprising:
a reconfigurable system, said reconfigurable system comprising (A) a plurality of functional components and (B) a plurality of connectors configured for operatively connecting any of said plurality of functional components in more than one configuration to any other one or more of said plurality of functional components;
a stimulus generator configured to apply a stimulus to said reconfigurable system; and
a measurement system configured to measure a response to said applied stimulus, said response generated by said reconfigurable system; wherein the stimulus generator, the measurement system, and the reconfigurable system including the plurality of functional components and the plurality of connectors are contained within a unitary package;
a computer device comprising a memory and a processor operably coupled to said memory;
electronic design automation software loaded in said memory and executed on said processor;
a user interface connected to the computer device and configured for permitting a user to interact with the electronic design automation software to design a circuit and cause the designed circuit to be built in an automated manner by the reconfigurable system including the plurality of functional components and the plurality of connectors within the unitary package.

15. The personal laboratory according to claim 14, wherein said reconfigurable system is selected from one or a combination of the following types of systems: electrical, magnetic, mechanical, optical, fluid, thermal, sensor, actuator, biological, and chemical/chemistry.

16. The personal laboratory according to claim 14, wherein said functional components comprise micromechanical devices.

17. A method of using an electronics personal laboratory, said method comprising:
providing a reconfigurable circuit, said reconfigurable circuit comprising a plurality of circuit elements and a plurality of electrical connectors configured for electrically connecting any of said plurality of circuit elements in more than one configuration to any other of said plurality of circuit elements;
providing a signal generator and a data acquisition system (DAQ) each electrically connected to the reconfigurable circuit, wherein the signal generator, the data acquisition system (DAQ), and the reconfigurable circuit including the plurality of circuit elements and the plurality of electrical connectors are contained within a unitary package;
designing a circuit using a user interface of a computer device with software loaded in a memory of the computer device and executed by a processor of the computer device;
causing the designed circuit to be built in an automated manner by the reconfigurable circuit including the plurality of circuit elements and the plurality of electrical connectors within the unitary package;
applying a stimulus to said reconfigurable circuit, said signal generator configured to apply said stimulus to said reconfigurable circuit; and
measuring a response to said applied stimulus with said data acquisition system (DAQ), said response generated by said reconfigurable circuit.

18. The method of claim 17 wherein said plurality of circuit elements comprises at least one of the following: a resistor, an inductor, a capacitor, a transistor, a diode, an operational amplifier, an electrical source, and a meter.

19. The method of claim 17 wherein each of said plurality of electrical connectors is configured for electrically connecting a respective one of said plurality of circuit elements to one or more other ones of said plurality of circuit elements, for electrically disconnecting the respective one of said plurality of circuit elements from the one or more other ones of said plurality of circuit elements, and for electrically reconnecting the respective one of said plurality of circuit elements to the one or more other ones of said plurality of circuit elements or electrically connecting the respective one of said plurality of circuit elements to another one or more other ones of said plurality of circuit elements.

20. The method of claim 17 wherein said electrical connectors comprise microelectromechanical system (MEMS) relays and/or semiconductor switches, and wherein said reconfigurable circuit comprises a field-programmable analog array.

* * * * *